(12) United States Patent
Stumpf et al.

(10) Patent No.: US 12,669,400 B2
(45) Date of Patent: Jun. 30, 2026

(54) OPTICAL LEAK SENSING WITH FLEXIBLE WAVEGUIDES

(71) Applicant: DELL PRODUCTS L.P., Round Rock, TX (US)

(72) Inventors: Michael Stumpf, Cedar Park, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 82 days.

(21) Appl. No.: 18/819,684

(22) Filed: Aug. 29, 2024

(65) Prior Publication Data

US 2026/0063502 A1     Mar. 5, 2026

(51) Int. Cl.
| | |
|---|---|
| *G01M 3/00* | (2006.01) |
| *F21V 8/00* | (2006.01) |
| *G01M 3/16* | (2006.01) |
| *G01M 3/38* | (2006.01) |
| *H05K 7/20* | (2006.01) |

(52) U.S. Cl.
CPC ............... *G01M 3/38* (2013.01); *G01M 3/16* (2013.01); *G02B 6/0036* (2013.01); *H05K 7/20218* (2013.01)

(58) Field of Classification Search
CPC ............ G01M 3/00; G01M 3/38; G01M 3/04; G01M 3/16; G01M 3/20; G02B 6/0036; H05K 7/20; H05K 7/20218
See application file for complete search history.

(56) References Cited

U.S. PATENT DOCUMENTS

| | | |
|---|---|---|
| 2016/0178475 A1 | 6/2016 | Krishnan et al. |
| 2022/0196507 A1* | 6/2022 | Subrahmanyam ... H05K 7/2079 |
| 2022/0291072 A1 | 9/2022 | Stumpf et al. |
| 2022/0312645 A1 | 9/2022 | Gao |

FOREIGN PATENT DOCUMENTS

| | | | | |
|---|---|---|---|---|
| WO | WO-2014135978 A2 * | 9/2014 | ............. | G06F 1/206 |
| WO | WO-2016103785 A1 * | 6/2016 | ............. | G01M 3/38 |

* cited by examiner

*Primary Examiner* — Abdullahi Nur
(74) *Attorney, Agent, or Firm* — Larson Newman, LLP

(57) ABSTRACT

An optical detector for detecting a coolant leak from a liquid cooling system within an information handling system includes a light source and a sensor configured to absorb light emitted from objects illuminated by the light source. A first flexible waveguide is communicatively coupled to the light source, and a second flexible waveguide is communicatively coupled to the sensor. The optical detector is configured to detect a potential coolant leak in response to the sensor absorbing light having a predetermined characteristic. The light is reflected from an object illuminated by the first flexible waveguide. The reflected light is transmitted to the sensor via the second flexible waveguide.

20 Claims, 9 Drawing Sheets

OPTICAL LEAK SENSING WITH FLEXIBLE WAVEGUIDES

FIELD OF THE DISCLOSURE

The present disclosure generally relates to information handling systems, and more particularly relates to optical detection of liquid coolant within an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An optical detector for detecting a coolant leak from a liquid cooling system within an information handling system includes a light source and a sensor configured to absorb light emitted from objects illuminated by the light source. A first flexible waveguide is communicatively coupled to the light source, and a second flexible waveguide is communicatively coupled to the sensor. The optical detector is configured to detect a potential coolant leak in response to the sensor absorbing light having a predetermined characteristic. The light is reflected from an object illuminated by the first flexible waveguide. The reflected light is transmitted to the sensor via the second flexible waveguide.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
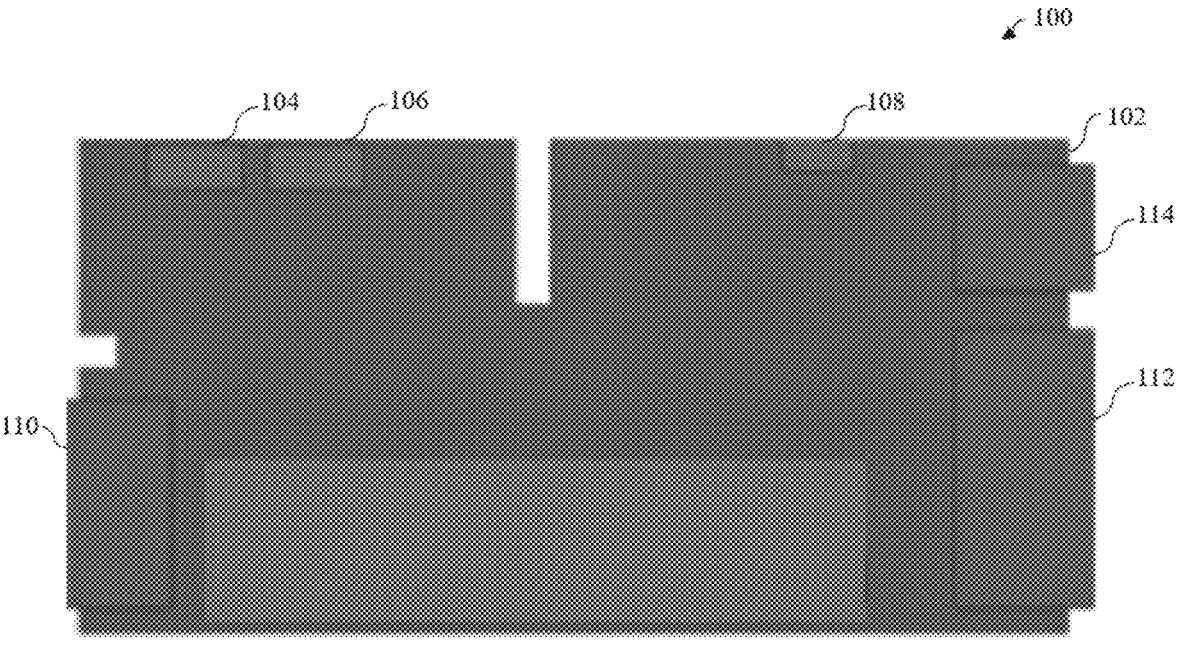
FIG. 1 is a front view an optical detector according to an embodiment of the present disclosure.

FIG. 1 illustrates optical detector 100. Optical detector 100 illustratively includes circuit board 102, one or more light sources 104 and 106, sensor 108, and communication circuity 110 and 112. Optical detector 100, in certain arrangements, may be integrated into the mainboard of an information handling system. In other arrangements, optical detector 100 may be a stand-alone device that connects internally to an information handling system, for example by connecting to an internal partition, side region, cover, or other part of the information handling system. Accordingly, in some embodiments, optical detector 100 includes one or more connectors 114. Optical detector 100 is capable of detecting a potential coolant leak from a liquid cooling apparatus or subsystem used to cool an information handling system.

For purposes of this disclosure, an information handling system is one that includes a liquid cooling apparatus or sub-system and that also can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, such an information handling system may be a personal computer (such as a desktop or laptop), server (such as a blade server or rack server), a network storage device, or any other suitable device and may vary in size, shape, performance, functionality, and price. The information handling system may include random-access memory (RAM), one or more processing resources such as a central processing unit (CPU), graphics processing unit (GPU), hardware and/or software control logic, as well as read-only memory (ROM) and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

As the processing power of information handling systems continues to increase, the use of liquid cooling is expected to become more common owing to certain advantages that liquid cooling offers over other types of cooling. Notwithstanding the advantages of liquid cooling, however, there is the possibility that one or more components of the liquid cooling system may develop leaks over time due to vibration, thermal cycles, aging, misalignment of heat exchangers and cold plates, or the like. Any leak that exposes the components of the information handling system to liquid can cause corrosion or damage to the circuitry within the system's housing. In certain arrangements, a leak occurring in one information handling system also may damage one or more nearby information handling systems if the systems are sufficiently close to one another. For example, a leak may occur in one of multiple servers stacked on a vertical rack (an increasingly common configuration). If the leak is not detected early enough, the coolant may spill out of one server and adversely affect one or more servers below it on the vertical rack.

Referring still to FIG. 1, circuit board 102 is certain arrangements is a printed circuit board (PCB) providing an optical sensor circuit board. Light sources 104 and 106, in contrast to more conventional arrangements, are positioned along an edge of circuit board 102. In certain embodiments, light sources 104 and 106 are surface mounted to the edge of circuit board 102. In some embodiments, light sources 104 and 106 are light emitting diodes (LEDs) and form an LED array. For example, the LEDs may be ultraviolet (UV) LEDs. Rather than having lenses that protrude from circuit board 102, as in more conventional arrangements, light sources 104 and 106 are instead formed with flat lenses. Sensor 108, in certain embodiments, is a photodetector array. The photodetector array may include multiple photodiodes.

Communication circuitry 110, in certain embodiments, is communicatively coupled with light sources 104 and 106 and is configured to activate the light sources and thereby illuminate certain components or regions within the housing of an information handling system. Sensor 108, in certain embodiments, is communicatively coupled with communications circuitry 112. Communications circuitry 112 also may communicatively couple with an alarm subsystem that may be either integrated in or external to the information handling system. Thus, in certain embodiments, in which the alarm subsystem is external to the information handling system, communications circuitry 112 may have wireless transmission capability to initiate the alarm via a wireless signal.

Operatively, a coolant illuminated by light sources 104 and 106 reflects light (having the same or a different wavelength) that is detected by sensor 108. The light detected by sensor 108 may have a predetermined wavelength identifiable by sensor 108 as corresponding to potential coolant leak. Optical detector 100 is configured to detect a potential coolant leak if sensor 108 absorbs light reflected from an object (e.g., collection of liquid coolant) illuminated by light sources 104 and 106 and having a predetermined characteristic, such as a predetermined wavelength or other sensor-measurable characteristic.

For example, the information handling system may be cooled by a liquid cooling apparatus or subsystem that circulates a coolant infused with a dye that fluoresces or reflects visible light when illuminated at a certain wavelength of light. Sensor 108, as a color sensor, may detect light reflected from the coolant when illuminated by light having a predetermined wavelength. Thus, in response to the coolant leak, sensor 108 "sees" the light reflected from the coolant when the coolant is illuminated by light sources 104 and 106 and initiates the alarm via communications circuitry 112.

Figure 2:
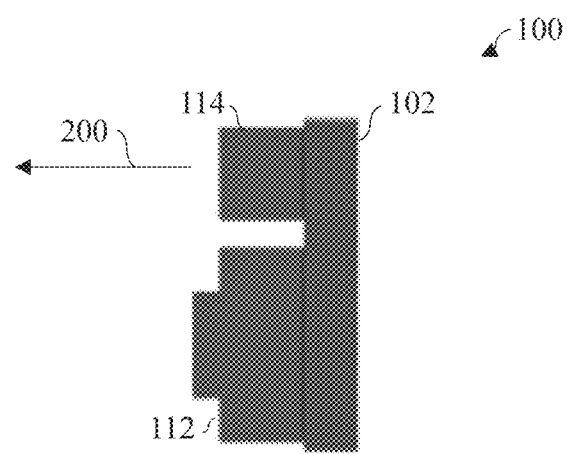
FIG. 2 is a side view the optical detector of FIG. 1.

FIG. 2 provides a side view of optical detector 100. Sensor 108, though obscured from view by connector 114 "sees" in direction 200. In certain embodiments, sensor 108 is likewise positioned along the edge of circuit board 102.

Figure 3:
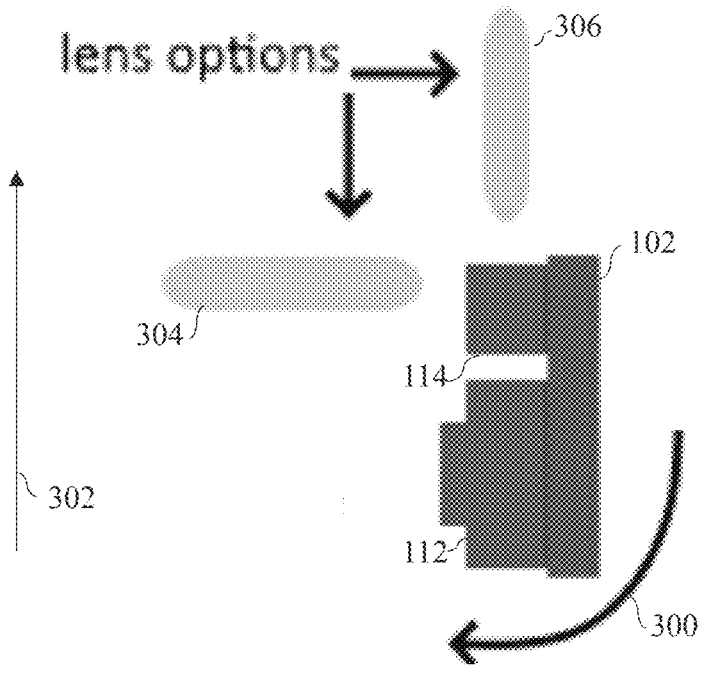
FIG. 3 is another side view the optical detector of FIG. 1.

FIG. 3 provides another side view of optical detector 100. Illustratively, circuit board 102 may be rotated ninety degrees in direction 300. If circuit board 102 is rotated ninety degrees in direction 300, then sensor 108 can see in direction 302. During the design phase, a decision may be made to fixedly position circuit board 102 such that sensor 108 sees either in direction 200 or in direction 302. In other embodiments, however, optical detector 100 may be pivotally connected to an internal partition, side region, cover, or other part of the information handling system via a hinge assembly. If pivotally connected, then during operation optical detector 100 may slowly sweep through a rotation in direction 300 enabling the optical detector to scan the interior of the information handling system in multiple directions. Sensor 108, in various arrangements, may see along the profile of a mainboard of an information handling system. It is additionally noted that sensor 108, in various embodiments, has different lens options 304 and 306, each having a distinct orientation as illustrated.

Surface mounting each of light sources 104 and 106 along an edge of circuit board 102 enables optical detector 100 to provide several advantages. These advantages include optical detector 100's ability to see into and along narrow spaces within an information handling system. In some arrangements, for example, optical detector 100 may be positioned along an edge of the mainboard of an information handling system. Sensor 108 is thus able to see in a direction along an edge of the mainboard. Another advantage of the arrangement is that optical detector 100 is less of an airflow impediment. Moreover, the performance of sensor 108 and/or light sources 104 and 106 positioned along an edge of circuit board 102 is enhanced by forming each with flat lenses.

In accordance with certain embodiments, optical detector 100 provides additional advantages by transmitting and/or sensing light using one or more flexible waveguides. The flexible waveguides may be an optical fiber or light pipe that guides light by confining the light within a core having a refractive index higher than that of a surrounding cladding. One flexible waveguide may transmit light from light sources 104 and 106 to illuminate virtually any region within the housing of an information handling system. Another flexible waveguide may carry reflected light back to sensor 108.

Figure 4:
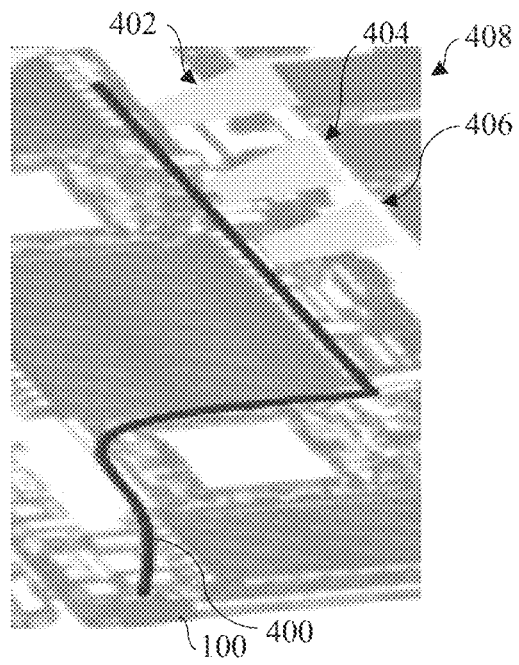
FIG. 4 is a perspective view of a portion of an example information handling system mainboard in which an optical detector having a flexible waveguide is positioned according to an embodiment of the present disclosure.

FIG. 4 illustrates an embodiment of optical detector 100 that includes flexible waveguide 400. Flexible waveguide 400, in various embodiments, may be a light pipe or optical fiber that operates as a waveguide for electromagnetic (EM) energy within a portion of the EM spectrum. As a light pipe, flexible waveguide 400 may be formed from an acrylic material such as poly(methyl methacrylate) (PMMA) or other low-cost synthetic polymer having a high refraction index and light transmission capability. Flexible waveguide 400 transmits light from light sources 104 and 106 and may illuminate specific objects or targeted regions within the housing of an information handling system. The maneuverability of flexible waveguide 400 within structures having complex geometries and/or narrow confines enables the illumination of densely packed and/or difficult to see regions of an information handling system. Illustratively, flexible waveguide 400 is formed to emit light 402, 404, and 406 and illuminate three distinct areas of mainboard 408.

As flexible waveguide 400 transmits light from light sources 104 and 106 to illuminate distinct regions of mainboard 408, a second flexible waveguide (not explicitly shown) may extend along the same path, parallel with flexible waveguide 400, or along a different path. In either arrangement, the second flexible waveguide transmits light reflected from objects or regions illuminated by emitted light 402, 404, and 406. The second flexible waveguide transmits the reflected light to sensor 108. The flexible waveguides may be colored to implement optical filtering. For example, the first flexible waveguide may transmit UV light while the second flexible waveguide that receives reflected light may pass visible light (e.g., green) but not UV light. Filtering, in various embodiments, may be achieved by material selection. For example, the first flexible waveguide that transmits light from light sources 104 and 106 may be formed from from an acrylic material such as PMMA, and the second flexible waveguide that receives reflected light and conveys the light to sensor 108 may be formed from a polycarbonate.

Figure 5:
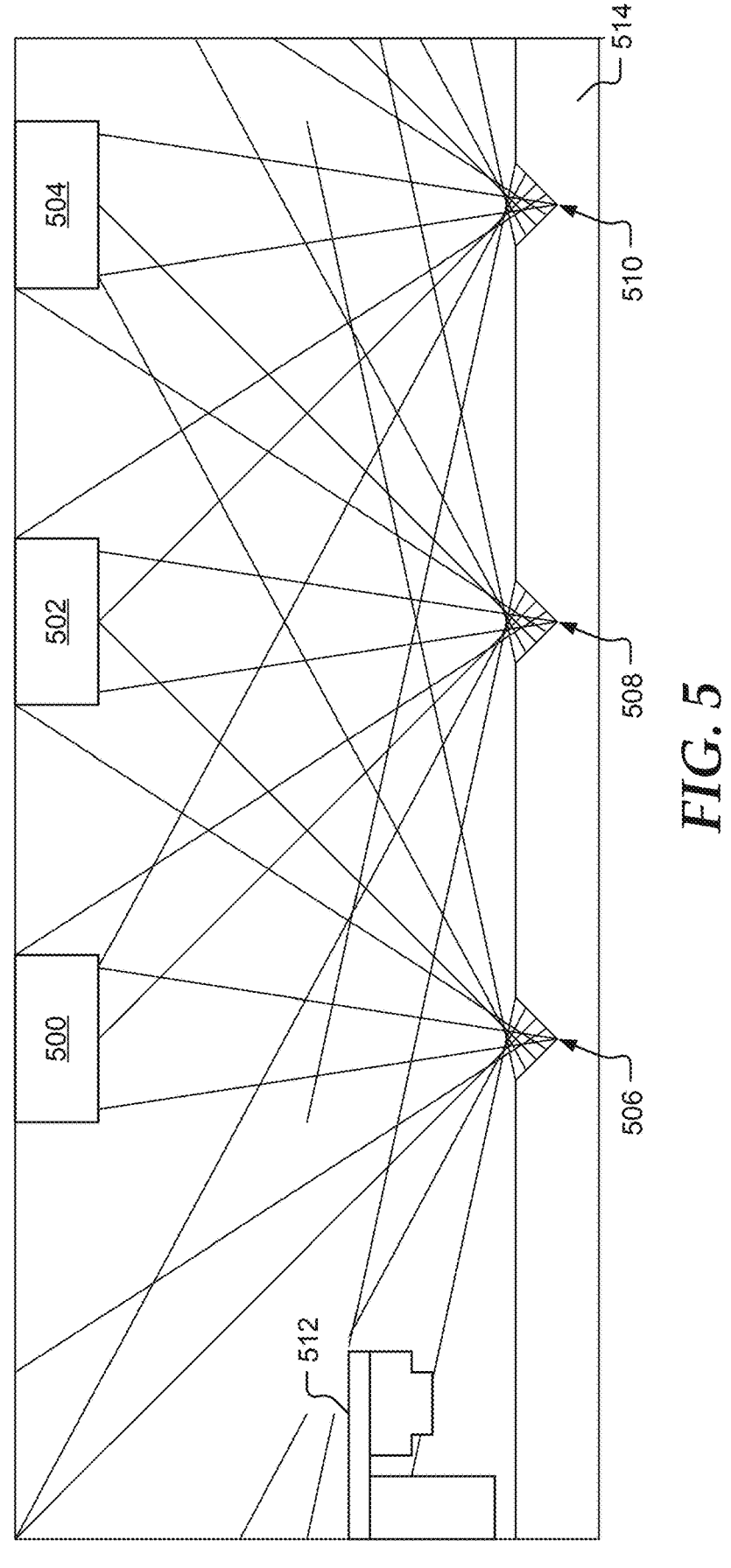
FIG. 5 illustrates illumination of multiple objects within the housing of an information handling system according to an embodiment of the present disclosure.

FIG. 5 illustrates a high-intensity illumination of objects 500, 502, and 504 within the information handling system's housing. Objects 500, 502, and 504 are illuminated by light emitted from notches 506, 508, and 510, respectively. Total internal reflection (TIR) constrains the light injected by light source 512 into flexible waveguide 514. TIR constrains the light within the internal confines of flexible waveguide 514. The injected light transmitted by flexible waveguide 514 is emitted only where the injected light encounters a sharp edge or bend in the waveguide. Illustratively, the light emanates from the sharp edges of notches 508, 510, and 512 formed in flexible waveguide 514.

Figure 6:
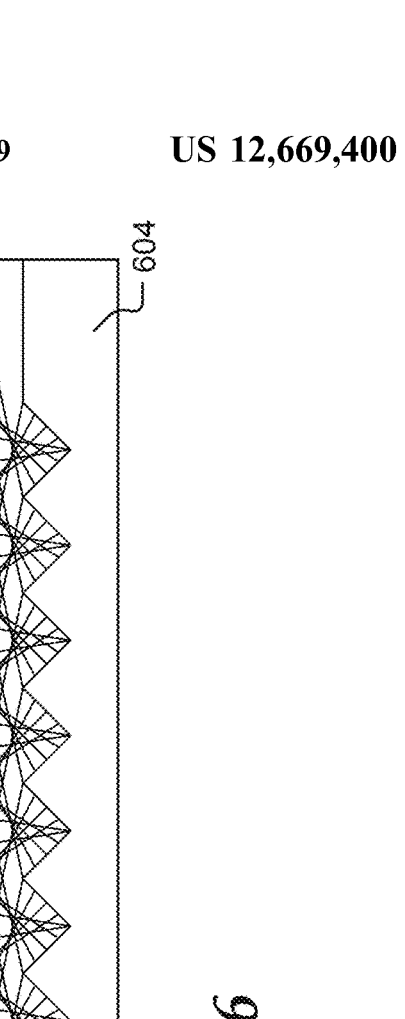
FIG. 6 illustrates illumination of an extended region within the housing of an information handling system according to an embodiment of the present disclosure.

FIG. 6 illustrates illumination of extended region 600 within the housing of an information handling system. Light injected from light source 602 is transmitted by flexible waveguide 604 and emitted from an extended portion 606 of the waveguide. Extended portion 606 has been abraded to create irregular sharp features in the surface of flexible waveguide 604. The abrasion of extended portion 606 creates a wider beam of light emission from flexible waveguide 604 and enables illumination of extended region 600.

Figure 7:
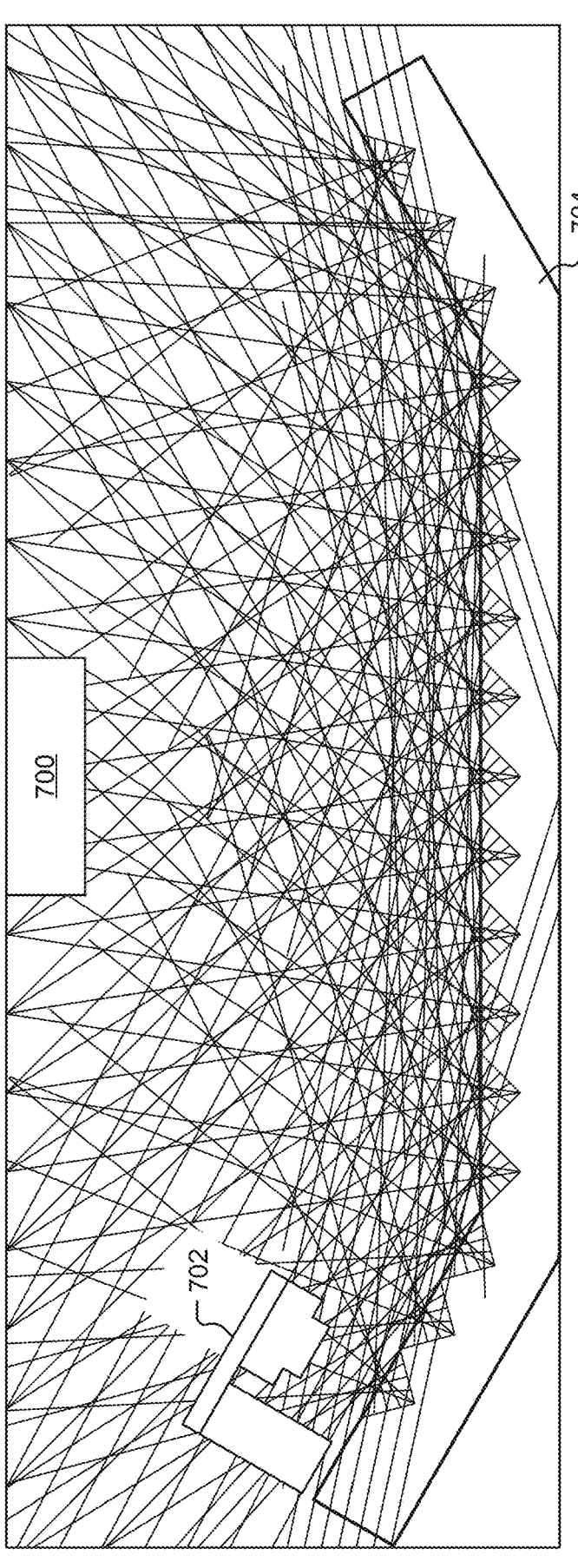
FIG. 7 illustrates focal-point illumination of object within the housing of an information handling system according to an embodiment of the present disclosure.

FIG. 7 illustrates focal-point illumination of object 700 by light transmitted from light source 702 by flexible waveguide 704. Object 700 may be a critical component or region within the housing of an information handling system. The focal point is created by the curvature of flexible waveguide 704, creating an arc that concentrates the light emitted from the abraded region of the waveguide. Concentrating the emitted light at the focal point enables strong illumination of object 700.

Figure 8:
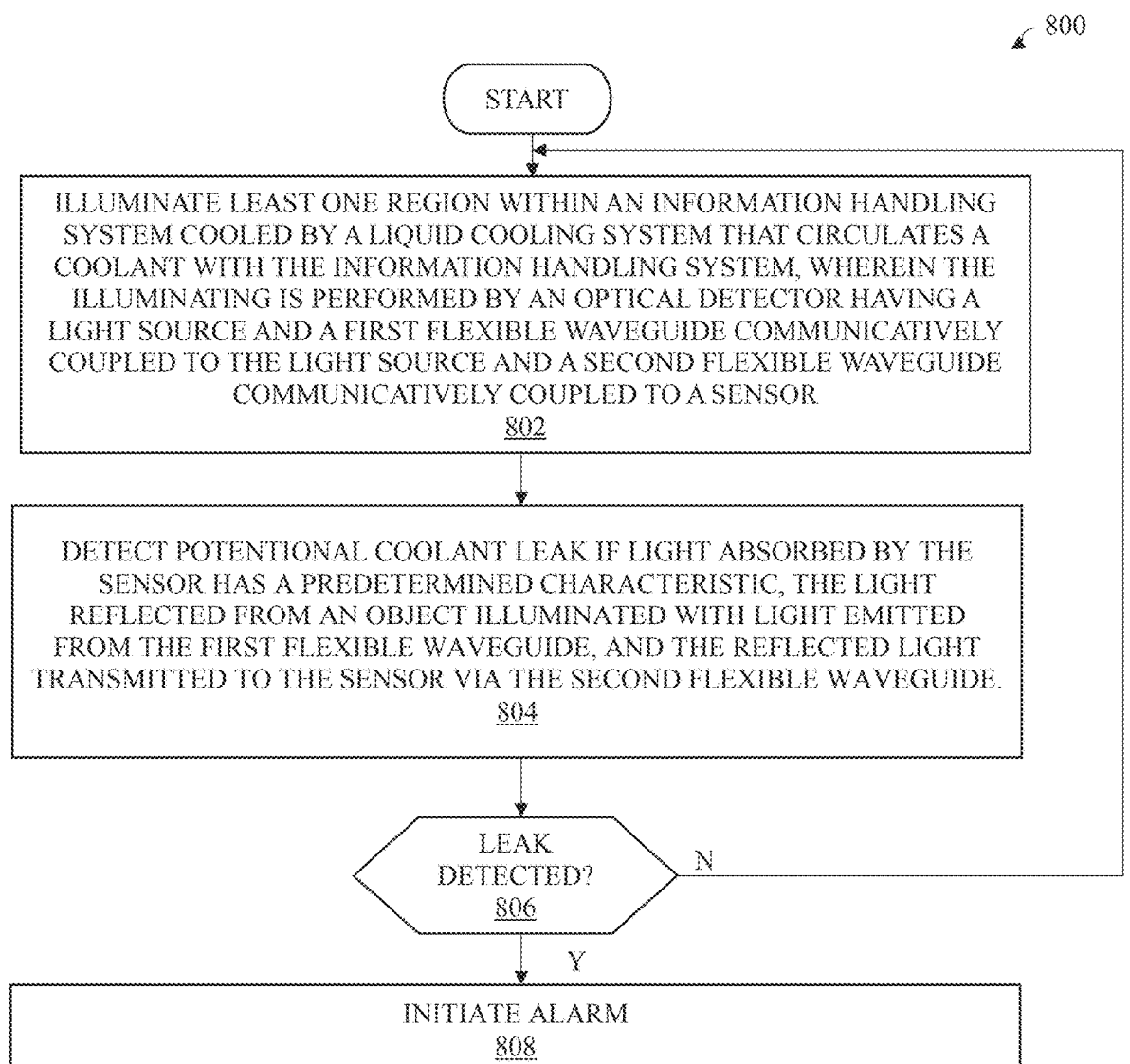
FIG. 8 is a flow diagram of a method for detecting a potential coolant leak within the housing of an information handling system according to an embodiment of the present disclosure.

FIG. 8 is a flow diagram of method 800 for detecting a coolant leak within an information handling system according to an embodiment of the present disclosure. It will be readily appreciated that not every method step set forth in this flow diagram is always necessary, and that certain steps of the methods may be combined, performed simultaneously, in a different order, or perhaps omitted, without varying from the scope of the disclosure. Method 800 may be performed with an optical detector such as optical detector described with reference FIGS. 1-7.

At block 802, at least one region within the information handling system is illuminated. The information handling system is cooled by a liquid cooling system that circulates a coolant with the information handling system. The illuminating is performed by a light source and a first flexible waveguide communicatively coupled to the light source of the optical detector. The light source, in certain embodiments, is an LED array. The first flexible waveguide, in certain embodiments, is a light pipe formed from PMMA or another synthetic polymer. The optical detector also includes a second flexible waveguide communicatively coupled to a sensor. The second flexible wave guide, in certain embodiments, is also a light pipe formed from PMMA or another synthetic polymer. The sensor, in certain embodiments, is a photodetector assembly such as an array of photodiodes.

At block 804, the optical detector detects a potential coolant leak if light absorbed by the sensor has a predetermined characteristic. The predetermined characteristic may be a wavelength or other sensor-measurable characteristic. The light is light that is reflected from an object that is illuminated by the first flexible waveguide, which transmits light from the light source to a location sufficiently near to the object to illuminate it. The light reflected from the illuminated object is transmitted to the sensor by the second flexible waveguide.

At decision block 806, the optical detector determines whether a potential leak has occurred. If so, the optical detector initiates an alarm at block 808. The alarm may be initiated with communications circuitry operatively coupled with the sensor and with an alarm system. In certain embodiments, if the alarm system is external to the information handling system, the alarm is initiated by the communications circuitry wirelessly transmitting a signal to the alarm system. If no potential leak is detected at decision block 806, then optical detector returns to block 802 and repeats the procedure to continue monitoring for a leak within the information handling system.

The sensor, in certain embodiments, is positioned along an edge of an optical circuit board of the optical detector. In certain embodiments, the light source may be positioned along an edge of an optical sensor circuit board of the optical detector. The light source is formed with a flat lens in certain embodiments.

In certain embodiments, multiple notches are formed in the first flexible waveguide to illuminate multiple, distinct regions within the information handling system. Additionally, or alternatively, an extended portion of the first flexible waveguide may be abraded to illuminate an extended region within the information handling system. In still other embodiments, the first flexible waveguide may be bent into a lens shape to form a focal point that is to be aimed at a specific area of the information handling system.

Figure 9:
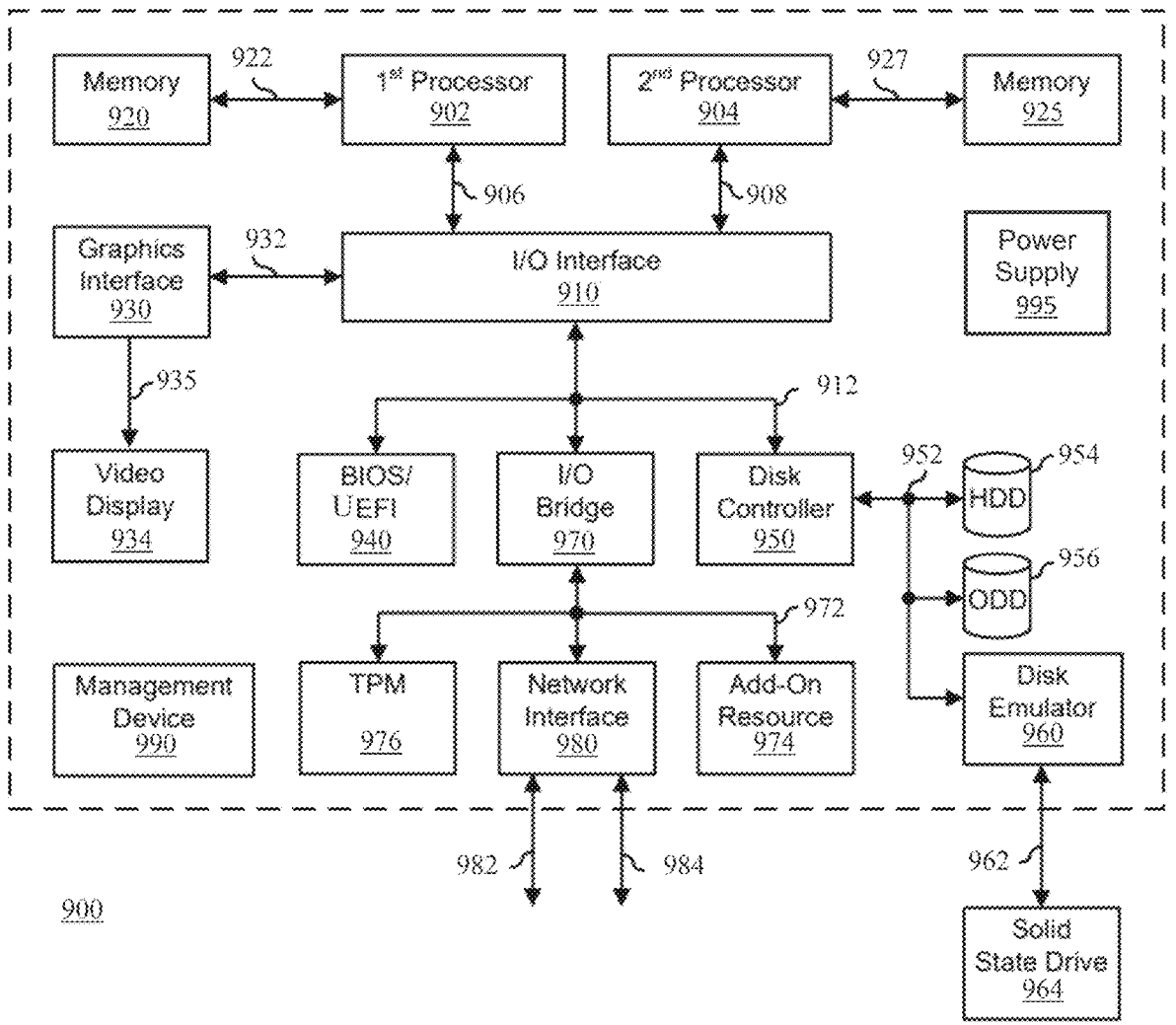
FIG. 9 is a block diagram of a general information handling system according to an embodiment of the present disclosure.

FIG. 9 shows a generalized embodiment of an information handling system 900 according to an embodiment of the present disclosure. Information handling system 900 may include a liquid cooling apparatus or subsystem and may include an optical detector substantially similar to optical detector 100 described with reference to FIGS. 1-7. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below and operates to perform one or more of the methods described below. Information handling system 900 includes a processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 964, an I/O bridge 970, one or more add-on resources 974, a trusted platform module (TPM) 976, a network interface 980, a management device 990, and a power supply 995. Processors 902 and 904, I/O interface 910, memory 920, graphics interface 930, BIOS/UEFI module 940, disk controller 950, HDD 954, ODD 956, disk emulator 960, SSD 964, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 927. Graphics interface 930 is connected to I/O interface 910 via a graphics interface 932 and provides a video display output 936 to a video display 934. In a particular embodiment, information handling system 900 includes separate memories that are dedicated to each of processors 902 and 904 via separate memory interfaces. An example of memories 920 and 930 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI- Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 4394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912 or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fiber Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900.

Management device 990 can operate off a separate power plane from the components of the host environment so that the management device receives power to manage information handling system 900 when the information handling system is otherwise shut down. An example of management device 990 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

That which is claimed is:

1. An optical detector for detecting a coolant leak from a liquid cooling system within an information handling system, the optical detector comprising:

a light source;

a sensor configured to absorb light emitted from objects illuminated by the light source;

a first flexible waveguide communicatively coupled to the light source; and a second flexible waveguide communicatively coupled to the sensor, wherein the optical detector is configured to detect a potential coolant leak in response to the sensor absorbing light having a predetermined characteristic, wherein the light is reflected from an object illuminated by the first flexible waveguide, and wherein the light reflected is transmitted to the sensor via the second flexible waveguide.

2. The optical detector of claim 1, further comprising an optical sensor circuit board wherein the light source is surface-mounted to an edge of the optical sensor circuit board.

3. The optical detector of claim 1, further comprising an optical sensor circuit board wherein the sensor is surface-mounted to an edge of the optical sensor circuit board.

4. The optical detector of claim 1, wherein the light source is formed with a flat lens.

5. The optical detector of claim 1, wherein the light source is an ultraviolet (UV) light-emitting diode.

6. The optical detector of claim 1, wherein the sensor is a photodetector assembly comprising an array of photodiodes.

7. The optical detector of claim 1, wherein the first and second flexible waveguides are formed of an acrylic material.

8. The optical detector of claim 1, wherein a plurality of notches are formed in the first flexible waveguide to illuminate multiple, distinct regions within the information handling system.

9. The optical detector of claim 1, wherein an extended portion of the first flexible waveguide is abraded to illuminate an extended region within the information handling system.

10. The optical detector of claim 9, wherein the first flexible waveguide is bent into a lens shape to form a focal point to be aimed at a specific area of the information handling system.

11. A method, comprising:

illuminating at least one region within an information handling system cooled by a liquid cooling system that circulates a coolant with the information handling system, wherein the illuminating is performed by an optical detector having a light source and a first flexible waveguide communicatively coupled to the light source and a second flexible waveguide communicatively coupled to a sensor; and detecting a potential coolant leak in response to the sensor absorbing light matching a predetermined characteristic, wherein the light is reflected from an object illuminated by the first flexible waveguide, and wherein the light is transmitted to the sensor via the second flexible waveguide.

12. The method of claim 11, further comprising:

responsive to the detecting, initiating an alarm via communications circuitry communicatively coupled to an alarm system.

13. The method of claim 12, wherein the alarm system is external to the information handling system, and wherein the initiating includes the communications circuitry wirelessly transmitting a signal to the alarm system.

14. The method of claim 11, wherein the sensor is positioned along an edge of an optical circuit board of the optical detector.

15. The method of claim 11, wherein the light source is positioned along an edge of an optical sensor circuit board of the optical detector.

16. The method of claim 11, wherein the light source is formed with a flat lens.

17. The method of claim 11, wherein a plurality of notches are formed in the first flexible waveguide to illuminate multiple, distinct regions within the information handling system.

18. The method of claim 11, wherein an extended portion of the first flexible waveguide is abraded to illuminate an extended region within the information handling system.

19. The method of claim 18, wherein the first flexible waveguide is bent into a lens shape to form a focal point to be aimed at a specific area of the information handling system.

20. An information handling system, comprising:

at least one processor;

a memory operatively coupled with the at least one processor via a bus;

a liquid cooling subsystem within a housing containing the at least one processor, memory, and bus; and an optical detector positioned within the housing for detecting a coolant leak from the liquid cooling subsystem, the optical detector including;

a light source;

a sensor configured to absorb light emitted from objects illuminated by the light source;

a first flexible waveguide communicatively coupled to the light source; and a second flexible waveguide communicatively coupled to the sensor.

* * * * *